(12) United States Patent
Shah et al.

(10) Patent No.: US 7,396,711 B2
(45) Date of Patent: Jul. 8, 2008

(54) METHOD OF FABRICATING A MULTI-CORNERED FILM

(75) Inventors: Uday Shah, Portland, OR (US); Brian S. Doyle, Portland, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 11/320,437

(22) Filed: Dec. 27, 2005

(65) Prior Publication Data
US 2007/0148837 A1 Jun. 28, 2007

(51) Int. Cl.
*H01L 21/336* (2006.01)
*H01L 21/308* (2006.01)
*H01L 21/84* (2006.01)

(52) U.S. Cl. .................. 438/164; 438/734; 216/16; 216/79

(58) Field of Classification Search .............. 438/164, 438/719, 734, 182; 216/79, 16
See application file for complete search history.

(56) References Cited

U.S. PATENT DOCUMENTS

| | | | |
|---|---|---|---|
| 4,487,652 A * | 12/1984 | Almgren | ............... 438/713 |
| 4,906,589 A | 3/1990 | Chao | |
| 4,996,574 A | 2/1991 | Shirasaki et al. | |
| 5,124,777 A | 6/1992 | Lee et al. | |
| 5,338,959 A | 8/1994 | Kim et al. | |
| 5,346,839 A | 9/1994 | Sundaresan | |
| 5,391,506 A | 2/1995 | Tada et al. | |
| 5,466,621 A | 11/1995 | Hisamoto et al. | |
| 5,521,859 A | 5/1996 | Ema et al. | |
| 5,543,351 A | 8/1996 | Hirai et al. | |
| 5,545,586 A | 8/1996 | Koh | |
| 5,563,077 A | 10/1996 | Ha | |
| 5,578,513 A | 11/1996 | Maegawa | |
| 5,658,806 A | 8/1997 | Lin et al. | |
| 5,665,203 A * | 9/1997 | Lee et al. | ............... 438/585 |

(Continued)

FOREIGN PATENT DOCUMENTS

DE 102 03 998 A1 8/2003

(Continued)

OTHER PUBLICATIONS

V. Subramanian et al., "A Bulk-Si-Compatible Ultrathin-body SOI Technology for Sub-100m MOSFETS" Proceedings of the 57th Annual Device Research Conference, pp. 28-29 (1999).

(Continued)

*Primary Examiner*—M. Wilczewski
(74) *Attorney, Agent, or Firm*—Blakely, Sokoloff, Taylor & Zafman LLP (57) ABSTRACT

Embodiments of the present invention describe a method of forming a multi-cornered film. According to the embodiments of the present invention, a photoresist mask is formed on a hard mask film formed on a film. The hard mask film is then patterned in alignment with the photoresist mask to produce a hard mask. The width of the photoresist mask is then reduced to form a reduced width photoresist mask. A first portion of the film is then etched in alignment with the hard mask. The hard mask is then etched in alignment with the reduced width photoresist mask to form a reduced width hard mask. A second portion of the film is then etched in alignment with the reduced width hard mask.

21 Claims, 8 Drawing Sheets

U.S. PATENT DOCUMENTS

| | | | |
|---|---|---|---|
| 5,701,016 A | 12/1997 | Burroughs et al. | |
| 5,716,879 A | 2/1998 | Choi et al. | |
| 5,739,544 A | 4/1998 | Yuki et al. | |
| 5,776,821 A * | 7/1998 | Haskell et al. | 438/585 |
| 5,804,848 A | 9/1998 | Mukai | |
| 5,814,895 A | 9/1998 | Hirayama | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,888,309 A | 3/1999 | Yu | |
| 5,899,710 A | 5/1999 | Mukai | |
| 5,905,285 A | 5/1999 | Gardner et al. | |
| 6,018,176 A | 1/2000 | Lim | |
| 6,066,869 A | 5/2000 | Noble et al. | |
| 6,093,621 A * | 7/2000 | Tseng | 438/424 |
| 6,153,485 A | 11/2000 | Pey et al. | |
| 6,163,053 A | 12/2000 | Kawashima | |
| 6,165,880 A | 12/2000 | Yaung et al. | |
| 6,218,309 B1 * | 4/2001 | Miller et al. | 438/700 |
| 6,252,284 B1 | 6/2001 | Muller et al. | |
| 6,261,921 B1 * | 7/2001 | Yen et al. | 438/424 |
| 6,274,503 B1 * | 8/2001 | Hsieh | 438/734 |
| 6,359,311 B1 | 3/2002 | Colinge et al. | |
| 6,362,111 B1 * | 3/2002 | Laaksonen et al. | 438/725 |
| 6,376,317 B1 | 4/2002 | Forbes et al. | |
| 6,387,820 B1 * | 5/2002 | Sanderfer | 438/725 |
| 6,391,782 B1 | 5/2002 | Yu | |
| 6,396,108 B1 | 5/2002 | Krivokapic et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,459,123 B1 | 10/2002 | Enders et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,483,146 B2 * | 11/2002 | Lee et al. | 257/317 |
| 6,483,156 B1 | 11/2002 | Adkisson et al. | |
| 6,500,767 B2 * | 12/2002 | Chiou et al. | 438/720 |
| 6,501,141 B1 * | 12/2002 | Leu | 257/413 |
| 6,525,403 B2 | 2/2003 | Inaba et al. | |
| 6,562,665 B1 * | 5/2003 | Yu | 438/149 |
| 6,583,469 B1 | 6/2003 | Fried et al. | |
| 6,610,576 B2 | 8/2003 | Nowak | |
| 6,611,029 B1 | 8/2003 | Ahmed et al. | |
| 6,630,388 B2 | 10/2003 | Ishii et al. | |
| 6,635,909 B2 | 10/2003 | Clark et al. | |
| 6,642,090 B1 | 11/2003 | Fried et al. | |
| 6,645,797 B1 | 11/2003 | Buynoski et al. | |
| 6,645,826 B2 | 11/2003 | Yamazaki et al. | |
| 6,656,853 B2 | 12/2003 | Ito | |
| 6,657,259 B2 | 12/2003 | Fried et al. | |
| 6,680,240 B1 | 1/2004 | Maszara | |
| 6,689,650 B2 | 2/2004 | Gambino et al. | |
| 6,693,324 B2 | 2/2004 | Maegawa et al. | |
| 6,696,366 B1 * | 2/2004 | Morey et al. | 438/712 |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,690 B1 | 4/2004 | Wang et al. | |
| 6,730,964 B2 | 5/2004 | Horiuchi | |
| 6,744,103 B2 | 6/2004 | Snyder | |
| 6,756,657 B1 | 6/2004 | Zhang et al. | |
| 6,764,884 B1 | 7/2004 | Yu et al. | |
| 6,770,516 B2 | 8/2004 | Wu et al. | |
| 6,774,390 B2 | 8/2004 | Sugiyama et al. | |
| 6,787,402 B1 | 9/2004 | Yu | |
| 6,787,439 B2 | 9/2004 | Ahmed et al. | |
| 6,787,845 B2 | 9/2004 | Deleonibus | |
| 6,787,854 B1 | 9/2004 | Yang et al. | |
| 6,790,733 B1 | 9/2004 | Natzle et al. | |
| 6,794,313 B1 | 9/2004 | Chang | |
| 6,794,718 B2 | 9/2004 | Nowak et al. | |
| 6,798,000 B2 | 9/2004 | Luyken et al. | |
| 6,800,885 B1 | 10/2004 | An et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,812,111 B2 | 11/2004 | Cheong et al. | |
| 6,815,277 B2 | 11/2004 | Fried et al. | |
| 6,821,834 B2 | 11/2004 | Ando | |
| 6,833,588 B2 | 12/2004 | Yu et al. | |
| 6,835,614 B2 | 12/2004 | Hanafi et al. | |
| 6,835,618 B1 | 12/2004 | Dakshina-Murthy et al. | |
| 6,838,322 B2 | 1/2005 | Pham et al. | |
| 6,844,238 B2 | 1/2005 | Yeo et al. | |
| 6,849,556 B2 * | 2/2005 | Takahashi | 438/725 |
| 6,849,884 B2 | 2/2005 | Clark et al. | |
| 6,855,606 B2 | 2/2005 | Chen et al. | |
| 6,855,990 B2 | 2/2005 | Yeo et al. | |
| 6,858,478 B2 | 2/2005 | Chau et al. | |
| 6,867,433 B2 | 3/2005 | Yeo et al. | |
| 6,867,460 B1 | 3/2005 | Anderson et al. | |
| 6,869,868 B2 | 3/2005 | Chiu et al. | |
| 6,884,154 B2 | 4/2005 | Mizushima et al. | |
| 6,885,055 B2 | 4/2005 | Lee | |
| 6,897,527 B2 | 5/2005 | Dakshina-Murthy et al. | |
| 6,921,691 B1 | 7/2005 | Li et al. | |
| 6,921,963 B2 | 7/2005 | Krivokapic et al. | |
| 6,921,982 B2 | 7/2005 | Joshi et al. | |
| 6,960,517 B2 | 11/2005 | Rios et al. | |
| 6,967,351 B2 | 11/2005 | Fried et al. | |
| 6,974,738 B2 | 12/2005 | Hareland et al. | |
| 7,018,551 B2 * | 3/2006 | Beintner et al. | 216/11 |
| 7,045,401 B2 | 5/2006 | Lee et al. | |
| 7,060,539 B2 | 6/2006 | Chidambarrao et al. | |
| 7,061,055 B2 | 6/2006 | Sekigawa et al. | |
| 7,071,064 B2 * | 7/2006 | Doyle et al. | 438/283 |
| 7,074,623 B2 | 7/2006 | Lochtefeld et al. | |
| 7,112,478 B2 | 9/2006 | Grupp et al. | |
| 7,122,463 B2 | 10/2006 | Ohuchi | |
| 7,154,118 B2 | 12/2006 | Lindert | |
| 7,163,851 B2 | 1/2007 | Adadeer et al. | |
| 7,183,137 B2 | 2/2007 | Lee et al. | |
| 7,187,043 B2 | 3/2007 | Arai et al. | |
| 7,250,645 B1 * | 7/2007 | Wang et al. | 257/213 |
| 2001/0019886 A1 | 9/2001 | Bruce et al. | |
| 2002/0011612 A1 | 1/2002 | Hieda | |
| 2002/0036290 A1 | 3/2002 | Inaba et al. | |
| 2002/0081794 A1 | 6/2002 | Ito | |
| 2002/0166838 A1 | 11/2002 | Nagarajan | |
| 2002/0167007 A1 | 11/2002 | Yamazaki et al. | |
| 2003/0057486 A1 | 3/2003 | Gambino | |
| 2003/0067017 A1 | 4/2003 | Ieong et al. | |
| 2003/0085194 A1 | 5/2003 | Hopkins, Jr. | |
| 2003/0098488 A1 | 5/2003 | O'Keeffe et al. | |
| 2003/0102497 A1 | 6/2003 | Fried et al. | |
| 2003/0111686 A1 | 6/2003 | Nowak | |
| 2003/0122186 A1 | 7/2003 | Sekigawa et al. | |
| 2003/0143791 A1 | 7/2003 | Cheong et al. | |
| 2003/0151077 A1 | 8/2003 | Mathew et al. | |
| 2003/0201458 A1 | 10/2003 | Clark et al. | |
| 2003/0227036 A1 | 12/2003 | Sugiyama et al. | |
| 2004/0031979 A1 | 2/2004 | Lochtefeld et al. | |
| 2004/0036118 A1 | 2/2004 | Adadeer et al. | |
| 2004/0036126 A1 | 2/2004 | Chau et al. | |
| 2004/0036127 A1 | 2/2004 | Chau et al. | |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0110097 A1 | 6/2004 | Ahmed et al. | |
| 2004/0119100 A1 | 6/2004 | Nowak et al. | |
| 2004/0126975 A1 | 7/2004 | Ahmed et al. | |
| 2004/0166642 A1 | 8/2004 | Chen et al. | |

| | | | |
|---|---|---|---|
| 2004/0180491 A1 | 9/2004 | Arai et al. | |
| 2004/0191980 A1 | 9/2004 | Rios et al. | |
| 2004/0195624 A1 | 10/2004 | Liu et al. | |
| 2004/0198003 A1 | 10/2004 | Yeo et al. | |
| 2004/0219780 A1 | 11/2004 | Ohuchi | |
| 2004/0227187 A1 | 11/2004 | Cheng et al. | |
| 2004/0238887 A1 | 12/2004 | Nihey | |
| 2004/0256647 A1 | 12/2004 | Lee et al. | |
| 2004/0262683 A1 | 12/2004 | Bohr et al. | |
| 2004/0262699 A1 | 12/2004 | Rios et al. | |
| 2005/0035415 A1 | 2/2005 | Yeo et al. | |
| 2005/0093067 A1 | 5/2005 | Yeo et al. | |
| 2005/0093154 A1 | 5/2005 | Kottantharayil et al. | |
| 2005/0118790 A1 | 6/2005 | Lee et al. | |
| 2005/0127362 A1 | 6/2005 | Zhang et al. | |
| 2005/0139860 A1 | 6/2005 | Synder et al. | |
| 2005/0145941 A1 | 7/2005 | Bedell et al. | |
| 2005/0156171 A1 | 7/2005 | Brask et al. | |
| 2005/0156202 A1 | 7/2005 | Rhee et al. | |
| 2005/0167766 A1 | 8/2005 | Yagishita | |
| 2005/0184316 A1 | 8/2005 | Kim et al. | |
| 2005/0215022 A1 | 9/2005 | Adam et al. | |
| 2005/0224797 A1 | 10/2005 | Ko et al. | |
| 2005/0224800 A1 | 10/2005 | Lindert | |
| 2005/0227498 A1 | 10/2005 | Furukawa et al. | |
| 2005/0230763 A1 | 10/2005 | Huang et al. | |
| 2006/0014338 A1 | 1/2006 | Doris et al. | |
| 2006/0154478 A1 | 7/2006 | Hsu et al. | |
| 2006/0281325 A1* | 12/2006 | Chou et al. | 438/734 |
| 2007/0093010 A1* | 4/2007 | Mathew et al. | 438/182 |

FOREIGN PATENT DOCUMENTS

| | | |
|---|---|---|
| EP | 0 623 963 A1 | 11/1994 |
| EP | 1 202 335 A2 | 5/2002 |
| GB | 2 156 149 | 10/1985 |
| JP | 56-73454 * | 6/1981 |
| JP | 59 145538 A | 8/1984 |
| JP | 02-303048 A | 12/1990 |
| JP | 6-151387 * | 5/1994 |
| JP | 2003-298051 | 10/2003 |
| WO | WO 02/43151 A | 5/2002 |

OTHER PUBLICATIONS

Hisamoto et al., "A Folded-channel MOSFET for Deepsub-tenth Micron Era", 1998 IEEE International Electron Device Meeting Technical Digest, pp. 1032-1034 (1998).
Huang et al., "Sub 50-nm FinFET: PMOS", 1999 IEEE International Electron Device Meeting Technical Digest, pp. 67-70 (1999).
Auth et al., "Vertical, Fully-Depleted, Surroundings Gate MOSFETS On Sub-0.1um, Thick Silicon Pillars", 1996 54th Annual Device Research Conference Digest, pp. 108-190 (1996).
Hisamoto et al., "A Fully Developed Lean-Channel Transistor (DELTA)-A Novel Vertical Ultrathin SOI MOSFET", IEEE Electron Device Letters, V. 11(1), pp. 36-38 (1990).
Jong-Tae Park et al., "Pi-Gate SOI MOSFET" IEEE Electron Device Letters, vol. 22, No. 8, Aug. 2001, pp. 405-406.
Hisamoto, Digh et al. "FinFET- A Self-Aligned Double-Gate MOSFET Scalable to 20 nm", IEEE Transactions on Electron Devices, vol. 47, No. 12, Dec. 2000, pp. 2320-2325.
International Search Report PCT/US 03/26242.
International Search Report PCT/US 03/39727.
International Search Report PCT/US 03/40320.
T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.
A. Burenkov et al., "Corner Effect in Double and Tripe Gate FinFets", IEEE 2003, pp. 135-138.
S.T. Chang et al., "3-D Simulation of Strained Si/SiGe Heterojunction FinFETs", pp. 176-177.
International Search Report PCT/US2005/010505.
International Search Report PCT/US2005/020339.
International Search Report PCT/US03/40320.

International Search Report PCT/US2005/000947.
International Search Report PCT/US2005/033439, mailed Jan. 31, 2006 (7 pgs.).
International Search Report PCT/US2005/035380, mailed Feb. 13, 2006 (14 pgs.).
International Search Report PCT/US2005/037169, mailed Feb. 23, 2006 (11 pgs.).
Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.
Yang-Kyu Choi, et al., "A Spacer Patterning Technology for Nanoscale CMOS" IEEE Transactions on Electron Devices, vol. 49, No. 3, Mar. 2002, pp. 436-441.
W. Xiong, et al., "Corner Effect in Multiple-Gate SOI MOSFETs" 2003 IEEE, pp. 111-113.
Weize Xiong, et al., "Improvement of FinFET Electrical Characteristics by Hydrogen Annealing" IEEE Electron Device Letters, vol. 25, No. 8, Aug. 2004, XP-001198998, pp. 541-543.
Fu-Liang Yang, et al., "5nm-Gate Nanowire FinFET" 2004 Symposium on VLSI Technology Digest of Technical Papers, 2004 IEEE, pp. 196-197.
T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.
Jing Guo et al. "Performance Projections for Ballistic Carbon Nanotube Field Effect Transistors" Applied Physics Letters, vol. 80, No. 17, pp. 3192-2194 (Apr. 29, 2002).
Ali Javey et al., "High-K Dielectrics for Advanced Carbon-Nanotube Transistors and Logic Gates", Advance Online Publication, Published online, pp. 1-6 (Nov. 17, 2002).
Richard Martel et al., "Carbon Nanotube Field Effect Transistors for Logic Applications" IBM, T.J. Watson Research Center, 2001 IEEE, IEDM 01, pp. 159-162.
David M. Fried et al., "Improved Independent Gate N-Type FinFET Fabrication and Characterization", IEEE Electron Device Letters, vol. 24, No. 9, Sep. 2003, pp. 592-594.
David M. Fried et al., "Improved Independent Gate P-Type Independent-Gate FinFETs", IEEE Electron Device Letters, vol. 25, No. 4, Apr. 2004, pp. 199-201.
Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.
Charles Kuo et al., "A Capacitorless Double-Gate DRAM Cell Design for High Density Applications", 2002 IEEE International Electron Devices Meeting Technical Digest, Dec. 2002, pp. 843-846.
Takashi Ohsawa et al., "Memory Design Using a One-Transistor Gain Cell on SOI", IEEE Journal of Solid-State Circuits, vol. 37, No. 11, Nov. 2002, pp. 1510-1522.
T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).
B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.
R. Chau, "Advanced Metal Gate/High-K Dielectric Stacks for High-Performance CMOS Transistors", Proceedings of AVS 5th International Conference on Microelectronics and Interfaces, Mar. 2004, (3 pgs.).
International Search Report PCT/US2004/032442.
International Search Report and Written Opinion PCT/US2006/000378.
International Search Report PCT/US2006/024516.
International Search Report PCT/US2006/037643.
T. Ludwig et al., "FinFET Technology for Future Microprocessors" 2003 IEEE, pp. 33-34.
Peter A. Stolk et al. "Modeling Statistical Dopant Fluctuations in MOS Transistors", 1998 IEEE, IEEE Transactions on Electron Devices, vol. 45, No. 9, Sep. 19987, pp. 1960-1971.

Evert Seevinck et al., "Static-Noise Margin Analysis of MOS SRAM Cells" 1987 IEEE, IEEE Journals of Solid-State Circuits, vol. SC-22, No. 5, Oct. 1987.

Yang-Kyu Choi et al. "Sub-20nm CMOS FinFET Technologies", IEEE 2001, IEDM 01-421 to 01-424.

M. Ieong et al. "Three Dimensonal CMOS Devices and Integrated Circuits", IEEE 2003, CICC, San Jose, CA, Sep. 21-24, 2003, pp. 207-214.

E.J. Nowak et al., "Scaling Beyond the 65nm Node with FinFET-DGCMOS", IEEE 2003, CICC, San Jose, CA, Sep. 21-24, 2003, pp. 339-342.

E.C. Jones, "Doping Challenges in Exploratory Devices for High Performance Logic", 14th International Conference, Piscataway, NJ, Sep. 22-27, 2002, pp. 1-6.

T. Park et al. "PMOS Body-Tied FinFET (Omega MOSFET) Characteristics", Device Research Conference, Piscataway, NJ, Jun. 23-25, 2003, IEEE, pp. 33-34.

E.J. Nowak et al., "A Functional FinFET-DGCMOS SRAM Cell", International Electron Devices Meeting 2002, San Francisco, CA, Dec. 8-11, 2002, pp. 411-414.

Jae-Hyoun Park, "Quantum-wired MOSFET Photodetector Fabricated by Conventional Photolithography on SOI Substrate", Nanotechnology, 2004, 4th IEEE Conference on Munich, Germany, Aug. 16-19, 2004, Piscataway, NJ, pp. 425-427, XP010767302.

L. Chang et al. "CMOS Circuit Performance Enhancement by Surface Orientation Optimization" IEEE Transactions on Electron Devices, IEEE Service Center, Piscataway, NJ vol. 51, No. 10, Oct. 2004, pp. 1621-1627 XP001211140.

M. Stadele et al., "A Comprehensive Study of Corner Effects in Tri-gate Transistors", IEEE 2004, pp. 165-168.

Ali Javey et al., "Ballistic Carbon Nanotube Field-Effect Transistors", Nature, vol. 424, Aug. 7, 2003, pp. 654-657.

* cited by examiner

METHOD OF FABRICATING A MULTI-CORNERED FILM

BACKGROUND OF THE INVENTION

1. Field of the Invention

The present invention relates to the field of semiconductor processing and more particularly to a method of fabricating a multi-cornered semiconductor film and a multi-cornered tri-gate transistor.

2. Discussion of Related Art

In order to increase the performance of modern integrated circuits, such as microprocessors, silicon on insulator (SOI) transistors have been proposed. Silicon on insulator (SOI) transistors have an advantage in that they can be operated in a fully depleted manner. Fully depleted transistors have an advantage of ideal subthreshold gradients for optimized ON current/OFF current ratios.

Figure 1:
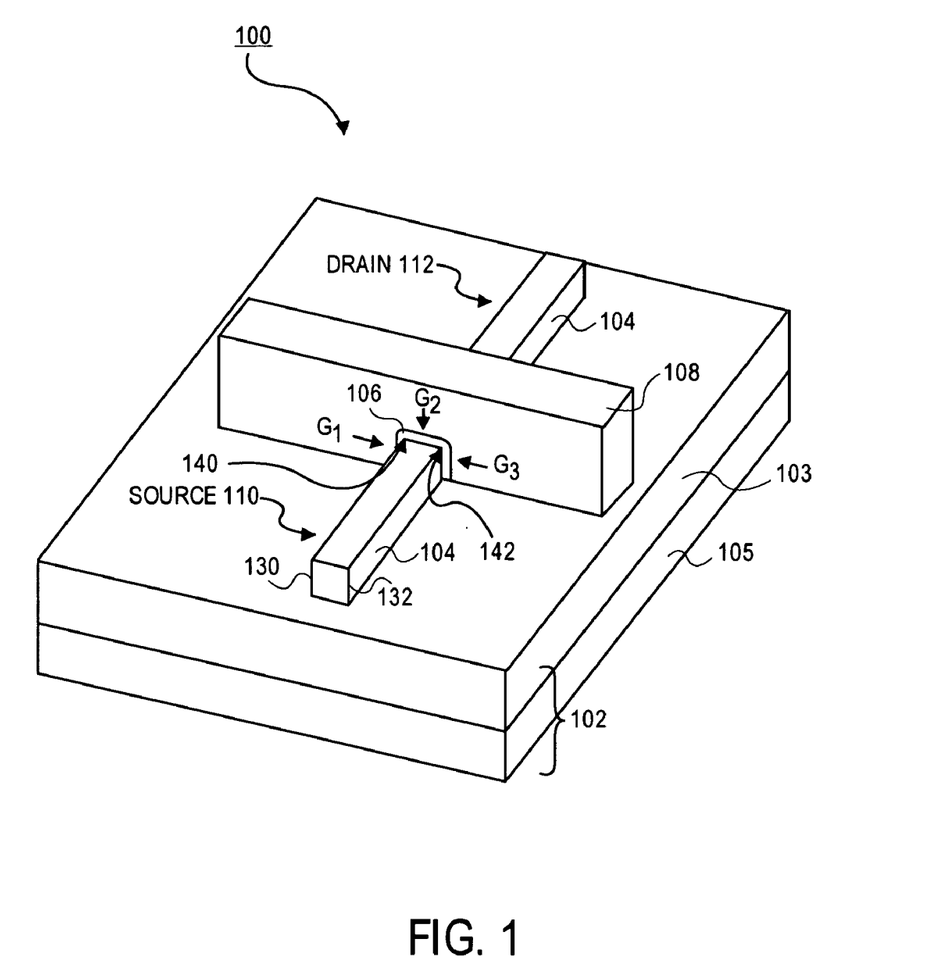
FIG. 1 is an illustration of a nonplanar or tri-gate transistor.

An example of a proposed SOI transistor which can be operated in a fully depleted manner is a nonplanar or tri-gate transistor 100, such as illustrated in FIG. 1. Tri-gate transistor 100 includes a silicon body 104 formed on an insulating substrate 102 having a buried oxide layer 103 formed on a monocrystalline silicon substrate 105. A gate dielectric layer 106 is formed on the top and sidewalls of the silicon body 104 as shown in FIG. 1. A gate electrode 108 is formed on the gate dielectric layer and surrounds the body 104 on three sides, essentially providing a transistor 100 having three gate electrodes ($G_1$, $G_2$, $G_3$), one on each of the sidewalls of the body 104 and one on the top surface of the body 104. A source region 110 and a drain region 112 are formed in the body 104 on opposite sides of the gate electrode 108 as shown in FIG. 1. The active channel region is the region of the silicon body beneath gate electrode 108 and between the source 110 and drain 112 regions.

An advantage of the tri-gate transistor 100 is that it exhibits superior short channel effects (SCE). One reason tri-gate transistor 100 exhibits superior short channel effects, is because the gate electrode 108 surrounds the active channel region on three sides. It has been determined that the corners 140 and 142 of the body exhibit near ideal subthreshold characteristics and are superior to those shown by the non-coener (sidewalls 130 and 132) portions of the device. In the subthreshold region and at low gate voltages the corners of the device dominate the full transistor characteristics. Above the threshold voltage, the larger non-corner portions of the channel region dominate transistor characteristics.

DETAILED DESCRIPTION OF THE PRESENT INVENTION

A method of forming multi-step or multi-cornered film is described. In the following description numerous specific details are set forth in order to provide a thorough understanding of the present invention. In other instances, well known semiconductor processing techniques and features have not been described in particular detail in order to not unnecessarily obscure the present invention.

Embodiments of the present invention describe a method of fabricating a multi-cornered film or structure. The method of the present invention is ideally suited forming a multi-cornered semiconductor body for a nonplanar transistor. A nonplanar transistor which has a semiconductor with multiple corners exhibits superior performance characteristics. The corners of the semiconductor body provide ideal subthreshold characteristics which are superior to non-corner portions of the transistor. In the subthreshold region of the device and at low gate voltages, the corners of the device dominate the full transistor characteristics. In embodiments of the present invention, a combination of an innovative resist trim, hard mask etch, and multiple semiconductor body etchings enable a stepped semiconductor body with multiple corners to be created. Although the method of the present invention is ideally suited for forming a multi-cornered semiconductor body of a nonplanar transistor, the method of the present invention may be used to fabricate a multi-cornered structure from any film and for any purpose desired. For example, the method of the present invention may be used to form a multi-cornered film for micro electrical mechanical systems (MEMS)

Figure 2A:
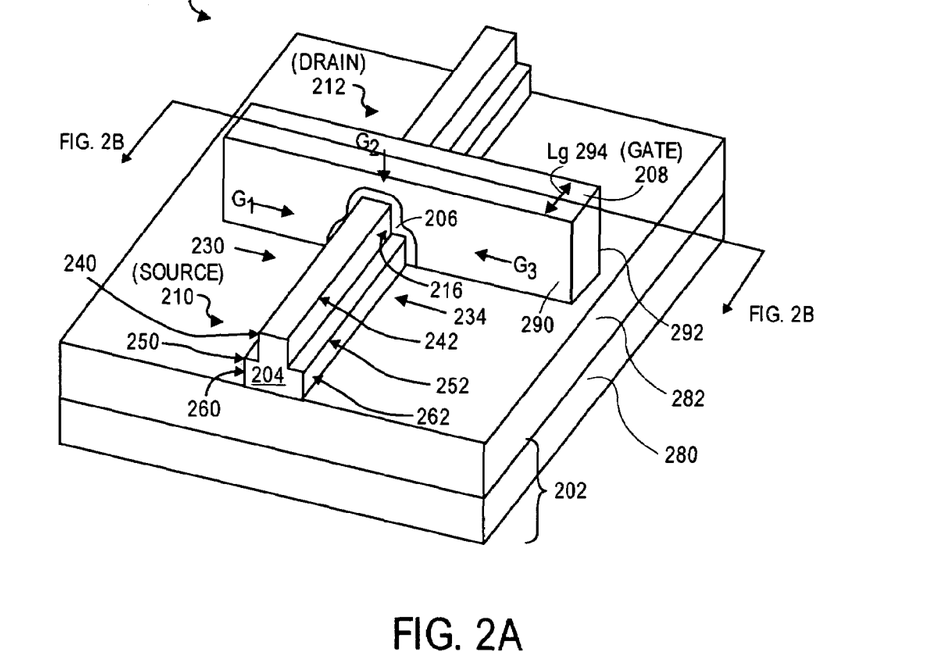
FIG. 2A is an illustration of a tri-gate transistor having a multi-cornered semiconductor film.
Figure 2B:
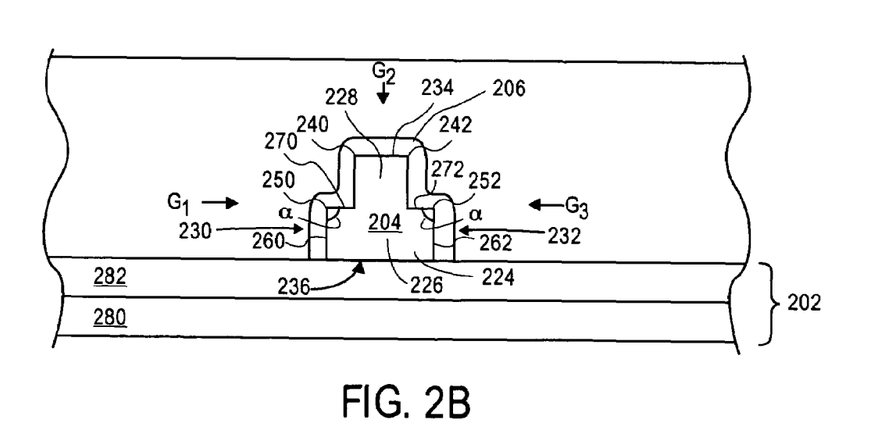
FIG. 2B is a cross-sectional view of the tri-gate transistor having a multi-cornered semiconductor film illustrated in FIG. 2A.

FIGS. 2A and 2B illustrate a nonplanar or tri-gate transistor 200 having a semiconductor body 204 with multiple corners. FIG. 2A is an overhead/side view of transistor 200, while FIG. 2B illustrates of a cross-sectional view taken through the gate electrode. Transistor 200 is formed on a substrate 202 and includes semiconductor body or fin 204 having a top surface 234 opposite a bottom surface 236 formed on insulating substrate 202. Semiconductor body 204 also has a pair of sidewalls 230 and 232. A gate dielectric layer 206 is formed on the top surface 234 and sidewalls 230 and 232 of semiconductor body 204. A gate electrode 208 is formed on the gate dielectric layer 206 and surrounds the semiconductor body or fin 204 on three sides. A source region 210 and a drain region 212 are formed in the semiconductor body on opposite sides of gate electrode 208 as shown in FIG. 2A.

As illustrated in FIGS. 2A and 2B, semiconductor body 204 includes two corners 240 and 242 which are formed by top surface 234 and sidewalls 230 ad 232, respectively, and top surface 234. Additionally, semiconductor body 204 includes at least one additional corner 250 and 252 on each sidewall 230 and 232, respectively. Comers 250 and 252 are formed by including an additional vertical surface 260 and 262 and a horizontal surface 270 and 272 on each sidewall 230 and 232, respectively. In an embodiment of the present invention, the vertical surface and horizontal surface intersect at an in angle ($\infty$) of 90° or substantially 90°. Comers 250 and 252 are ideally formed as sharp as possible. Accordingly, in an embodiment of the present invention, semiconductor body 204 has a lower body portion 226 and an upper body portion 228. In an embodiment of the present invention, the width of the lower body portion 226 is between 20-50 wherein the width is defined as the distance between sidewall portion 260 and 262. Additionally, in an embodiment of the present invention, the lower body portion 226 has a height of between 5 nm and 50 nm wherein the height is defined as the distance between horizontal surface 270/272 and lower surface 236. Additionally, in an embodiment of the present invention, the upper portion 228 has a width between 10 nm and 40 nm and height between 5 nm and 50 nm wherein the height is defined as a distance between top surface 234 and horizontal surface 270/272. In an embodiment of the present invention, the width of the top portion 222 is approximately 50% of the width of the bottom portion. In an embodiment of the present invention, the height of the top portion 202 is between 50-200% of the height of the lower portion 224.

Figure 4:
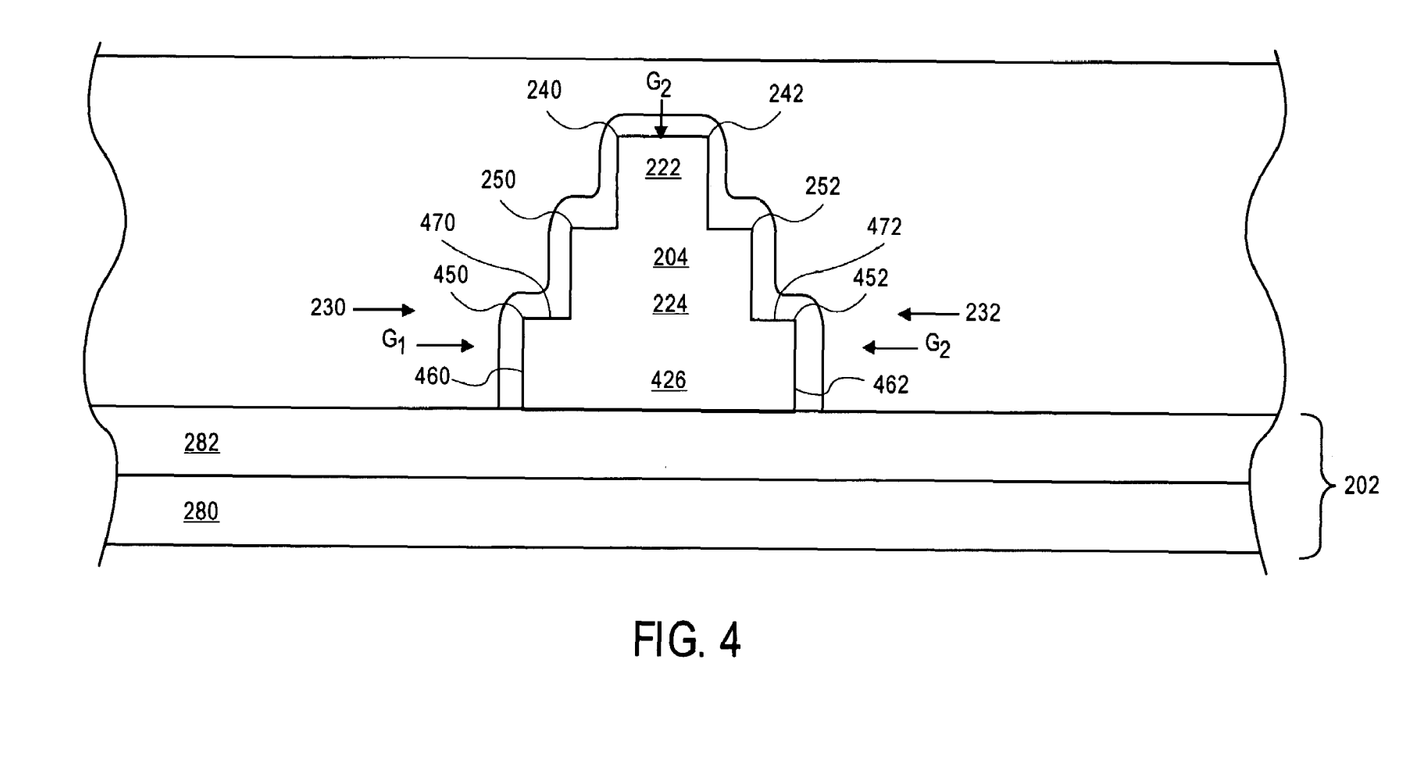
FIG. 4 is an illustration of a tri-gate transistor having a multi-cornered semiconductor film.

Additionally, in an embodiment of the present invention, as illustrated in FIG. 4, semiconductor body 204 can include a third 450 and fourth 452 additional corners by including an additional corner on each sidewall 230 and 232 as illustrated in FIG. 4. Corners 450 and 452 can be added by including an additional vertical surface 460/462 and horizontal surface 470/472 to create corners 450 and 452 on sidewalls 230 and 232, respectively. Including additional corners 450 and 452 creates a semiconductor body having a top portion, a mid portion and a bottom portion as illustrated in FIG. 4. It is to be appreciated that a semiconductor body 204 can include multiple corners by further including additional horizontal and vertical surface on the sidewalls of the semiconductor body. By continually decreasing the width of each successive portion of semiconductor body with increasing height creates sidewalls 230 and 232 with a "stair step" structure or profile as illustrated in FIGS. 2A and 2B.

In an embodiment of the present invention, the nonplanar transistor 200 is formed on an insulating substrate 202 which includes a lower monocrystalline silicon substrate 280 upon which is formed an insulating layer 282, such as a silicon dioxide film. In an embodiment of the present invention, insulating layer 282 is a buried oxide layer of a Silicon on Insulator (SOI) substrate. The tri-gate transistor 200, however, can be formed on any well known substrate, such as but not limited to bulk semiconductor substrates and insulating such as substrates formed from silicon dioxide, nitrides, oxides, and sapphires.

Semiconductor body 204 is formed on insulating layer 282 of insulating substrate 202. Semiconductor body 204 can be formed on any well known material, such as but not limited to silicon (Si), germanium (Ge), silicon germanium ($Si_xGe_y$), gallium arsenide (GaAs), InSb, GaP, GaSb and carbon nanotubes. Semiconductor body 204 can be formed of any well known material which can be reversely altered from an insulating state to a conductive state by applying external electrical controls. Semiconductor body 204 is ideally a single crystalline film when best electrical performance of transistor 200 is desired. For example, semiconductor body 204 is a single crystalline film when transistor 200 is used in higher performance applications, such as high density circuit, such as a microprocessor. Semiconductor body 204, however, can be a polycrystalline film when transistor 200 is used in applications requiring less stringent performance, such as liquid crystal displays. Insulator 252 isolates semiconductor body 204 from the monocrystalline silicon substrate 250. In an embodiment of the present invention, semiconductor body 204 is a single crystalline silicon film.

Gate dielectric layer 206 is formed on and around three sides of semiconductor body 204 as shown in FIGS. 2A and 2B. Gate dielectric layer 206 is formed on or adjacent to sidewall 230, on the top surface 234 of body 204 and on or adjacent to sidewall 232 of body 204 as shown in FIGS. 2A and 2B. Gate dielectric layer 206 can be any well known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 206 is a silicon oxynitride film formed to a thickness between 5-20 Å. In an embodiment of the present invention, gate dielectric layer 206 is a high k gate dielectric layer, such as a metal oxide dielectric, such as but not limited to tantalum oxide ($Ta_2O_5$), titanium oxide ($TiO_2$) and hafnium oxide ($HfO_2$). Gate dielectric layer 206 can be other types of high k dielectric layers, such as but not limited to PZT and BST.

Gate electrode 208 is formed on and around gate dielectric layer 206 as shown in FIGS. 2A and 2B. Gate electrode 208 is formed on or adjacent to gate dielectric layer 206 formed on sidewall 230 of semiconductor body 204, is formed on gate dielectric layer 206 formed on the top surface 234 of semiconductor body 204 and is formed adjacent to or on gate dielectric layer 206 formed on sidewall 232 of semiconductor body 204. Gate electrode 208 has a pair of laterally opposite sidewalls 290 and 292 separated by a distance which defines the gate length (Lg) 294 of transistor 200. In an embodiment of the present invention, laterally opposite sidewalls 290 and 292 of gate electrode 208 run in a direction perpendicular to sidewalls 230 and 232 of semiconductor body 204.

Gate electrode 208 can be formed of any suitable gate electrode material. In an embodiment of the present invention, gate electrode 208 comprises a polycrystalline silicon film doped to a concentration density between $1 \times 10^{19}$ atoms/$cm^3$ to $1 \times 10^{20}$ atoms/$cm^3$. In an embodiment of the present invention, the gate electrode can be a metal gate electrode, such as but not limited to tungsten, tantalum, titanium and their nitrides. In an embodiment of the present invention, the gate electrode is formed from a material having a midgap work function between 4.6 to 4.8 eV. It is to be appreciated that gate electrode 208 need not necessarily be a single material and can be a composite stack of thin films, such as but not limited to polycrystalline silicon/metal electrode or metal/polycrystalline silicon electrode.

Transistor 200 has a source region 210 and a drain region 212. Source region 210 and drain region 212 are formed in semiconductor 204 on opposite sides of gate electrode 208 as shown in FIG. 2A. Source region 210 and drain region 212 are formed to an n type conductivity type when forming a NMOS transistor and are formed to a p type conductivity when forming a PMOS device. In an embodiment of the present invention, source region 210 and drain region 212 have a doping concentration between $1 \times 10^{19}$ atoms/$cm^3$ to $1 \times 10^{21}$ atoms/$cm^3$. Source region 210 and drain region 212 can be formed of the uniform concentration or can include subregions of different concentrations or dopant profiles, such as tip regions (e.g., source/drain extensions) and contact regions. In an embodiment of the present invention, when transistor 200 is a symmetrical transistor, source region 210 and drain region 212 have the same doping concentration and profile. In an embodiment of the present invention, when transistor 200 is formed as an asymmetrical transistor, then the doping concentration profile of the source region 210 and drain region 212 may vary in order to any particular electrical characteristics as well known in the art. Source region 210 and drain region 212 can be collectively referred to as a pair of source/drain regions.

The portion of semiconductor body 204 located between source region 210 and drain region 212, defines the channel region 216 of transistor 200. The channel region 216 can also be defined as the area of the semiconductor body 204 surrounded by the gate electrode 208. At times however, the source/drain region may extend slightly beneath the gate electrode through, for example, diffusion to define a channel region slightly smaller than the gate electrode length (Lg). In an embodiment of the present invention channel region 216 is intrinsic or undoped monocrystalline silicon. In an embodiment of the present invention, channel region 216 is doped monocrystalline silicon. When channel region 216 is doped it is typically doped to a conductivity level of between $1\times10^{16}$ to $1\times10^{19}$ atoms/cm$^3$. In an embodiment of the present invention, when the channel region is doped it is typically doped to the opposite conductivity type of the source region 210 and the drain region 212. For example, when the source and drain regions are n type conductivity the channel region would be doped to p type conductivity. Similarly, when the source and drain regions are p type conductivity the channel region would be n type conductivity. In this manner a tri-gate transistor 200 can be formed into either a NMOS transistor or a PMOS transistor respectively. Channel region 216 can be uniformly doped or can be doped non-uniformly or with differing concentrations to provide particular electrical and performance characteristics. For example, channel regions 216 can include well-known "halo" regions, if desired.

By providing a gate dielectric and a gate electrode which surrounds the semiconductor body on three sides, the tri-gate transistor is characterized in having three channels and three gates, one gate and channel ($G_1$) which extends between the source and drain regions on side 230 of silicon body 204, a second gate and channel ($G_2$) which extends between the source and drain regions on the top surface 234 of silicon body 204, and a third gate and channel ($G_3$) which extends between the source and drain regions on the sidewall of silicon body 204. The gate "width" (Gw) of transistor 200 is the sum of the widths of the three channel regions. That is, the gate width of transistor 200 is equal to the length of sidewall 230 of silicon body 204, plus the length of top surface 234 of silicon body of 204, plus the length of sidewall 232 of silicon body 204. The length of each of the sidewalls 230 and 232 is the sum of each of the horizontal and vertical surface which make up the sidewalls 230 and 232. Larger "width" transistors can be obtained by using multiple devices coupled together (e.g., multiple silicon bodies 204 surrounded by a single gate electrode 208).

Because the channel region 216 is surrounded on three sides by gate electrode 208 and gate dielectric 206, transistor 200 can be operated in a fully depleted manner wherein when transistor 200 is turned "on" the channel region 216 fully depletes thereby providing the advantageous electrical characteristics and performance of a fully depleted transistor. That is, when transistor 200 is turned "ON" a depletion region is formed in channel region 216 along with an inversion layer at the surfaces of region 216 (i.e., an inversion layer is formed on the side surfaces and top surface of the semiconductor body). The inversion layer has the same conductivity type as the source and drain regions and forms a conductive channel between the source and drain regions to allow current to flow therebetween. The depletion region depletes free carriers from beneath the inversion layer. The depletion region extends to the bottom of channel region 216, thus the transistor can be said to be a "fully depleted" transistor.

Transistor 200 of the present invention can be said to be a nonplanar transistor because the inversion layer of channel 216 is formed in both the horizontal and vertical directions in semiconductor body 204.

Figure 3A:
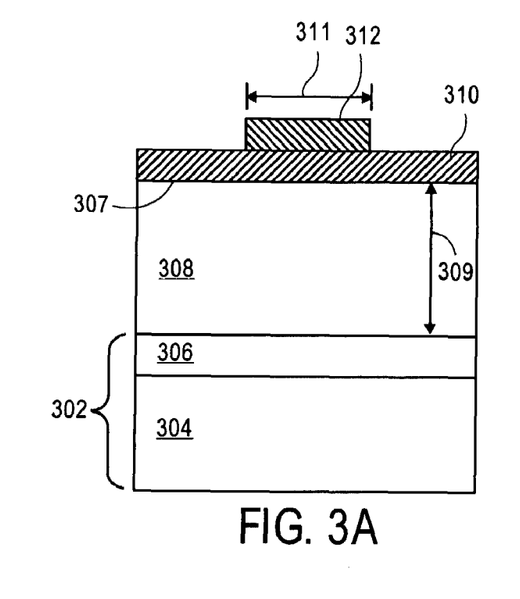
FIGS. 3A-3I illustrate a method of fabricating a tri-gate transistor having a multi-cornered semiconductor film.

FIGS. 3A-3I illustrates a method of forming a nonplanar transistor having a multi-cornered semiconductor body or fin. The fabrication of the transistor begins with substrate 302. A silicon or semiconductor film 308 is formed on substrate 302 as shown in FIG. 3A. In an embodiment of the present invention, the substrate 302 is an insulating substrate, such as shown in FIG. 3A. In an embodiment of the present invention, insulating substrate 302 includes a lower monocrystalline silicon substrate 304 and a top insulating layer 306, such as a silicon dioxide film or silicon nitride film. Insulating layer 306 isolates semiconductor film 308 from substrate 304, and in embodiment is formed to a thickness between 200-2000 Å. Insulating layer 306 is sometimes referred to as a "buried oxide" layer. When a silicon or semiconductor film 308 is formed on an insulating substrate 302, a silicon or semiconductor on insulating (SOI) substrate is created. In other embodiments substrate 302 is a bulk semiconductor substrate, such as a monocrystalline silicon substrate or silicon wafer.

Although semiconductor film 308 is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, as well as carbon nanotubes. In an embodiment of the present invention, semiconductor film 308 is an intrinsic (i.e., undoped) silicon film. In other embodiments, semiconductor film 308 is doped to a p type or n type conductivity with a concentration level between $1\times10^{16}$-$1\times10^{19}$ atoms/cm$^3$. Semiconductor film 308 can be insitu doped (i.e., doped while it is deposited) or doped after it is formed on substrate 302 by for example ion-implantation. Doping after formation enables both PMOS and NMOS tri-gate devices to be fabricated easily on the same insulating substrate. The doping level of the semiconductor body at this point can be used set the doping level of the channel region of the device.

In embodiment of the present invention, semiconductor film 308 is formed to a thickness which is approximately equal to the height desired for the subsequently formed semiconductor body or bodies of the fabricated nonplanar transistor. In an embodiment of the present invention, semiconductor film 308 has a thickness or height 309 of less than 30 nanometers and ideally less than 20 nanometers. In an embodiment of the present invention, semiconductor film 308 is formed to the thickness approximately equal to the gate "length" desired of the fabricated tri-gate transistor. In an embodiment of the present invention, semiconductor film 308 is formed thicker than desired gate length of the device. In an embodiment of the present invention, semiconductor film 380 is formed to a thickness which will enable the fabricated tri-gate transistor to be operated in a fully depleted manner for its designed gate length (Lg).

Semiconductor film 308 can be formed on the top surface 207 of insulating substrate 302 in any well-known method. In one method of forming a silicon on insulator substrate, known as the SIMOX (silicon implanted oxygen) technique, oxygen atoms are implanted at a high dose into a single crystalline silicon substrate and then anneal to form the buried oxide 306 within the substrate. The portion of the single crystalline silicon substrate above the buried oxide becomes the silicon film 308. Another technique currently used to form SOI substrates is an epitaxial silicon film transfer technique which is generally referred to as bonded SOI. In this technique a first silicon wafer has a thin oxide grown on its surface that will later serve as the buried oxide 306 in the SOI structure. Next, a high dose hydrogen implant is made into the first silicon wafer to form a high stress region below the silicon surface of the first wafer. This first wafer is then flipped over and bonded to the surface of a second silicon wafer. The first wafer is then cleaved along the high stress plain created by the hydrogen implant. This results in a SOI structure with a thin silicon layer on top, the buried oxide underneath all on top of the single crystalline silicon substrate. Well-known smoothing techniques, such as HCl smoothing or chemical mechanical polishing (CMP) can be used to smooth the top surface of semiconductor film 308 to its desired thickness.

At this time, if desired, isolation regions (not shown) can be formed into a substrate in order to isolate the various transistors to be formed therein from one another. Isolation regions can be formed by etching away portions of the substrate film 308 surrounding the areas for the nonplanar transistor and then back filling the etched regions with an insulating film, such as $SiO_2$.

A hard mask material 310 is formed on semiconductor film 308 as shown in FIG. 3A. Hard mask material 310 is a material which can provide a hard mask for the etching of the semiconductor film 308. A hard mask material is a material which can retain its profile during etching of the semiconductor film 308. A hard mask material 310 is a material which will not etch or only slightly etch during the etching of semiconductor film 308. In an embodiment of the present invention, the hard mask material is formed of a material such that the etchant used to etch the semiconductor film 308 will etch thin film 308 at least five times faster than the hard mask material and ideally at least ten times faster. In an embodiment of the present invention, when semiconductor film 308 is a silicon film, the hard mask material 310 can be a silicon nitride or silicon oxynitride film. Hard mask material 310 is formed to a thickness sufficient to retain its profile during the entire etch of semiconductor film 308 but not too thick to cause difficulty in its patterning. In an embodiment of the present invention, the hard mask material 410 is formed to a thickness between 3 nanometers to 20 nanometers and ideally to a thickness less than 10 nanometers.

Next, as also shown in FIG. 3A, a photoresist mask 312 is formed on hard mask layer 310. Photoresist mask 312 contains a feature pattern to be transferred into the semiconductor film 308. The photoresist mask 312 can be formed by any well known technique, such as by blanket depositing a photoresist material, and then masking, exposing and developing the photoresist film into a photoresist mask 312 having a desired pattern for the semiconductor film 308 to be patterned. Photoresist mask 312 is typically formed of an organic compound. Photoresist mask 312 is formed to a thickness sufficient to retain its profile while patterning the hard mask film 310 but yet is not formed to thick to prevent lithographic patterning into the smallest dimensions (i.e., critical dimensions) possible with photolithography system and process used. In an embodiment of the present invention the photoresist can be patterned by exposing to a 248 nm wavelength light. In an embodiment of the present invention, photoresist mask 312 has a width 311 of less than 30 nanometers and ideally 20 nanometers. The width 311 of photoresist mask 312 sets or determines the width of the lower or lowest portion of the semiconductor body.

Figure 3B:
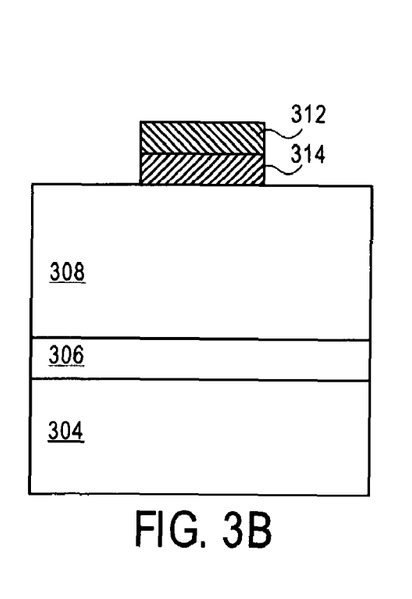

Next, as shown in FIG. 3B, the hard mask material 310 is etched in alignment with photoresist mask 312 to form a hard mask 314 as shown in FIG. 3B. Photoresist mask 312 prevents the underlying portion of hard mask material 310 from becoming etched. In an embodiment of the present invention, the hard mask is etched with an etchant which can etch the hard mask material but does not etch the underlying semiconductor film 308. When the hard mask material 314 is a silicon nitride or silicon oxynitride film, hard mask material 310 can be etched into a hard mask 314 utilizing a dry etch process, such as a reactive ion etching. In an embodiment of the present invention, a silicon nitride or silicon oxynitride hard mask is reactive ion etched utilizing chemistry comprising $CHF_3$ or $CH_2F_2$ and $O_2$ and Ar.

Figure 3C:
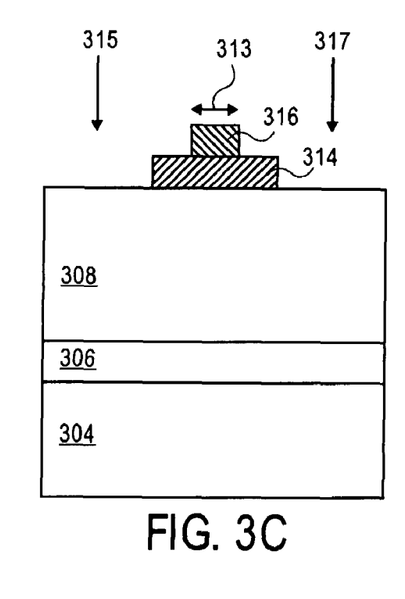

Next, as shown in FIG. 3C, the width of photoresist mask 312 is reduced to form a reduced width photoresist mask 316.

A reduced width photoresist mask 316 has a width 313 which is approximately the width desired for the upper portion of the semiconductor body. In an embodiment of the present invention, the width is reduced to between 30 and 50% of the width 311 of the original patterned photoresist film 312. In an embodiment of the present invention, the reduced width photoresist mask 316 has a width between 10-50 nm. In an embodiment of the present invention, the width of the photoresist mask 312 is reduced utilizing a plasma ashing process. In an embodiment of the present invention, the photoresist mask 312 is reduced utilizing $O_2$ plasma ashing process carried out at approximately room temperature. In an embodiment of the present invention, the O2 plasma ashing occurs for approximately 15-30 seconds. The plasma ashing process reduces the width of the photoresist mask 312 uniformly on both sides. The width of the reduced width photoresist mask is used to set the width of the top portion of the semiconductor body.

Figure 3D:
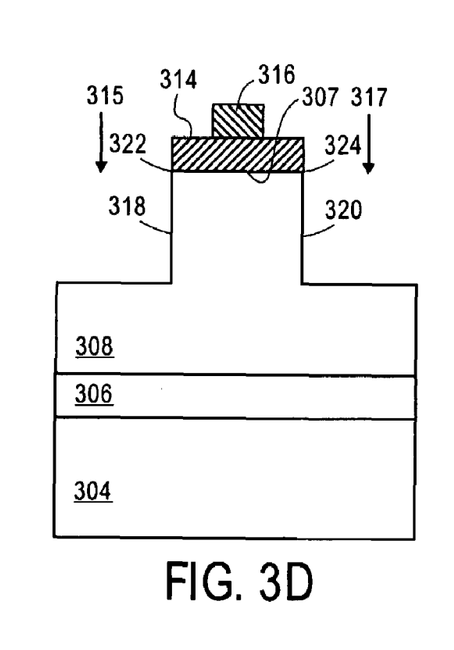

Next, as shown in FIG. 3D, portions 315 and 317 of the semiconductor film 308 not covered by hard mask 314 are partially etched in alignment with hard mask 314. The first etching of a semiconductor film 308 utilizes an anisotropic etching process to form a first pair of vertical sidewalls 318 and 320 in semiconductor film 308. The anisotropic etch process produces corners 322 and 324 between sidewalls 318 and 320 in top surface 307. The anisotropic etch process produces sharp corners having angles of approximately 90°. Additionally, the length of sidewalls 318 and 320 generally determines or sets the height of the lower portion of the semiconductor body. The distance between sidewalls 318 and 320 sets the width for the lower portion of a semiconductor body. A time etch can be used etch portions 315 and 317 of the semiconductor film 308 to a desired depth and create sidewalls 318 and 320 with a desired length. In an embodiment of the present invention, the portion of the semiconductor film which remains on insulating substrate 308 is substantially equal to the height desired of the top portion of the semiconductor body. The semiconductor film is ideally etched with a process which can anisotropically etch semiconductor film 308 without significantly etching hark mask 314 or eroding reduced width photoresist mask 316. In an embodiment of the present invention, when the hard mask 314 is a silicon nitride or silicon oxynitride film, and semiconductor film 308 is a silicon film, the silicon film 308 can be etched utilizing the electron cyclotron residence (ECR) plasma etching process utilizing a gas chemistry comprising HBr/Cl2/O2.

Figure 3E:
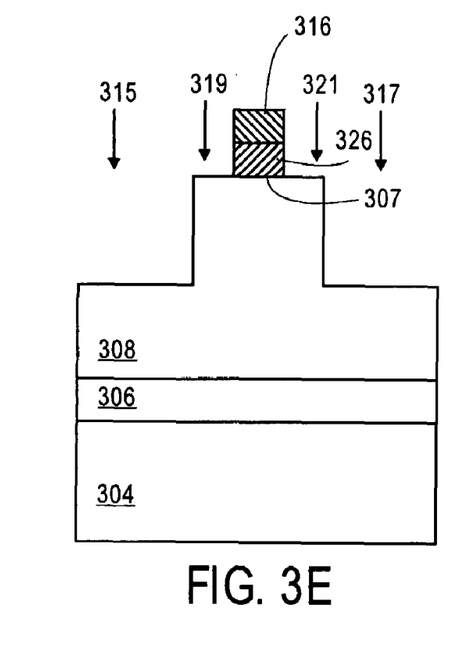

Next, as shown in FIG. 3E, hard mask 314 is etched in alignment with reduced width photoresist mask 316 to produce a reduced width hard mask 326. Reduce width hard mask 326 has a width substantially equal to the width of reduced width photoresist mask 316. The width of reduced width photoresist mask 316 may have slightly eroded during the first etching of semiconductor film 308. Hard mask 314 can be etched into a reduced width hard mask 326 utilizing the hard mask etch described above.

Figure 3F:
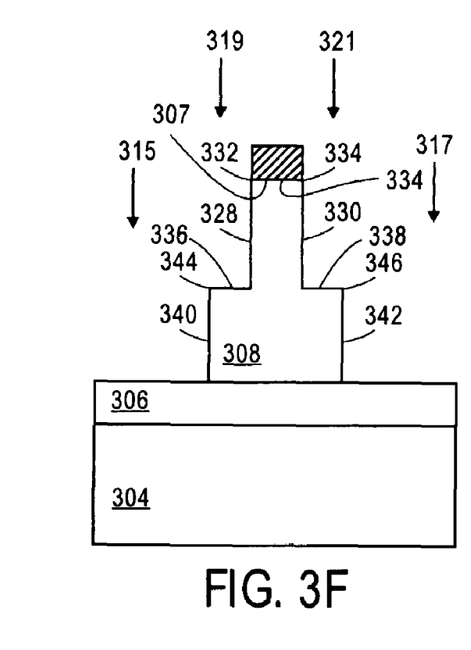

Next, as shown in FIG. 3F, the reduced width photoresist mask 316 is removed from reduced width hard mask 326. In an embodiment of the present invention, the reduced width photoresist mask 316 is removed with a high temperature $O_2$ plasma ashing. In an embodiment of the present invention, the wafer is held at a temperature of approximately 300° C. during the $O_2$ plasma ashing to remove the photoresist mask 316.

Next, as shown in FIG. 3F, semiconductor film 308 is etched a second time. The second etching of semiconductor film 308 is an anisotropic etch in alignment with the reduced width hard mask 326. The second etching of the semiconductor film 308 in alignment with reduced width hard mask 326 further etches semiconductor film 308 in areas 315 and 317 and etches previously unetched portions 319 and 321 a first time. The second etch produces vertical sidewalls 328 and 330 and forms corners 332 and 334 at the intersections of sidewalls 328 and 330 and top surface 307, respectively. Additionally, the second etching produces horizontal surfaces 336 and 338 in areas 319 and 321. The second etching is continued until the semiconductor film in areas 315 and 317 is completely etched away to reveal buried oxide layer 306 of insulating substrate 302. The second etching of semiconductor film 308 in areas 315 and 317 produces vertical sidewall portions 340 and 342. Second etching produces a corner 344 at the intersection of horizontal surface 336 and sidewall portion 340 and a corner 346 at the intersection of vertical sidewall 342 and horizontal surface 338. As is readily apparent, the second etching of the semiconductor film 308 downwardly translates corners 322 and 324 into corners 344 and 346 and sidewalls 318 and 320 into sidewalls 340 and 342. In an embodiment of the present invention, when the semiconductor film 308 is silicon and the hard mask is a silicon nitride film, semiconductor film 308 can be etched utilizing an ECR plasma etching processing utilizing a process gas chemistry comprising HBr/Cl2/O2.

Figure 3G:
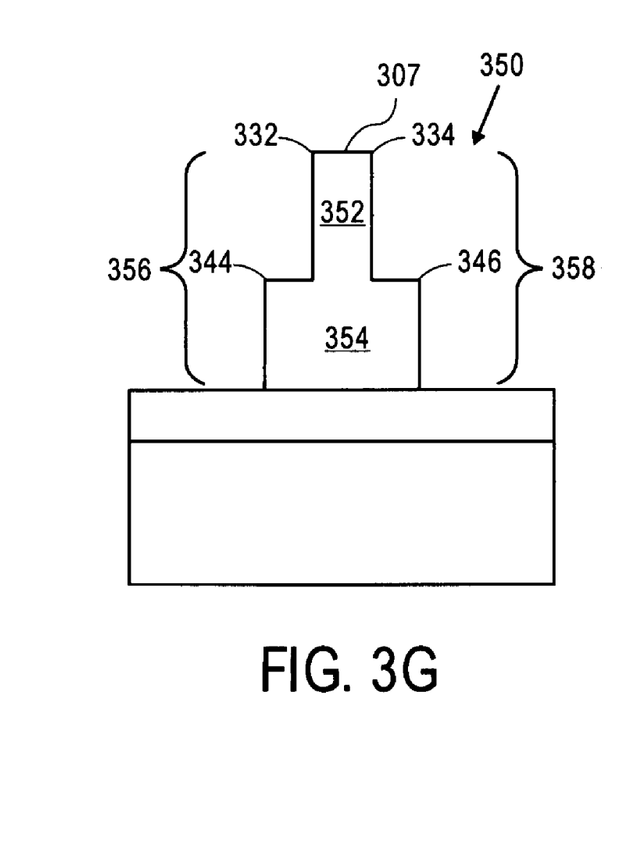

Next, as shown in FIG. 3G, reduced width hard mask 326 is removed from the top surface 311 of semiconductor film 308. The reduced width hard mask can be removed with a wet etchant comprising phosphoric acid and $H_2O$. The result is the formation of a semiconductor body 350 having a top portion 352 and a bottom portion 354. The semiconductor body 350 has a pair of opposite sidewalls 356 and 358. Additionally, the semiconductor body 350 includes two top corners 332 and 334 made between sidewall 356 and 358 and top surface 307, respectively. Additionally, semiconductor body 350 includes two additional corners 344 and 346 formed on sidewall 356 and 358, respectively. The two step etch process of an embodiment of the present invention, has resulted in a semiconductor body having a pair of sidewalls 356 and 358 each with a stair step configuration.

As is readily apparent, the first width of the photoresist mask/hard mask sets the width of the lower body portion. Additionally, the second or reduced width photoresist mask/hard mask is used to set the width of the upper body portion. Similarly, the depth of the first etch of the semiconductor film essentially sets the thickness or height of the lower body portion while the depth of the second etch of the semiconductor film essentially sets the thickness or height of the upper body portion. It is to be appreciated that if the second etch significantly over etches after reaching the oxide layer, then the height of the lower body portion will be decreased further and the height of the upper body portion will be increased. In an embodiment of the present invention, the first etch etches half way through the thickness of the semiconductor film and the second etch etches the remainder of the semiconductor film so that the top portion and bottom portion have the same thickness or height.

It is to be appreciated that processes illustrated in FIG. 3A-3F can be repeated multiple times to generate semiconductor bodies with additional corners, such as illustrated in FIG. 4. For example, after forming reduced width hard mask 322 as shown in FIG. 3E, the width of the reduced width photoresist mask 316 can be further reduced to provide a second reduced width photoresist mask having a further reduced width. After etching the semiconductor film 308 a second time as illustrated in FIG. 3F, the second reduced width photoresist mask can be used to pattern the reduced width hard mask 322 into a second reduced width hard mask, which can then be used to pattern the semiconductor film 308 during a third etching process. In such a case, the first etch sets the thickness and width of a lower body portion, the second etch sets the thickness and width of the mid body portion and the third etch sets the thickness and width of the top portion. In an embodiment of the present invention, when three etches are utilized, the first etch can be used to etch the first third of a film, the second etch can then be used to etch through the second third of the film and the third etch would etch through the third, third of the film. In this way, the top body portion, the mid body portion and lower body portion would each have the same width or thickness. Similarly, in an embodiment of the present invention, the width of the hard mask is reduced the same percentage each time so that the width of the semiconductor body is reduced proportionally. In this way, a semiconductor body with as many corners or body portions as desired may be fabricated.

Figure 5A:
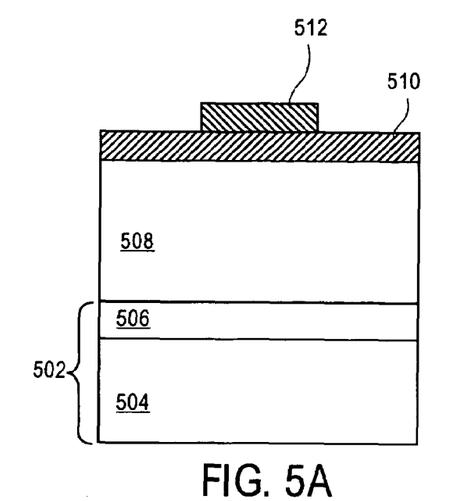
FIGS. 5A-5F illustrates a method of fabricating a multi-cornered film in accordance with an embodiment of the present invention.
Figure 5B:
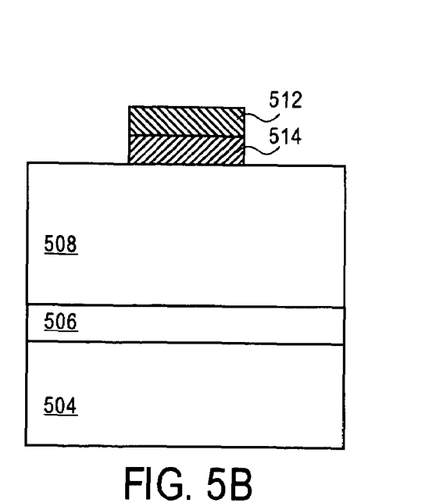
Figure 5C:
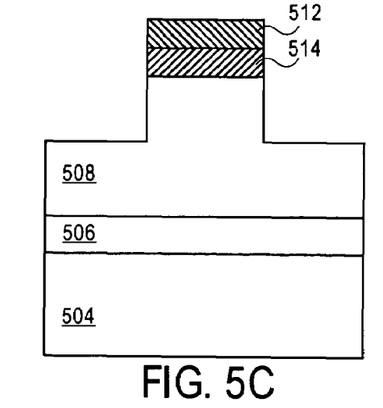
Figure 5D:
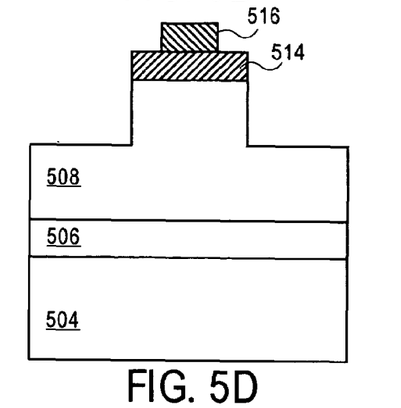
Figure 5E:
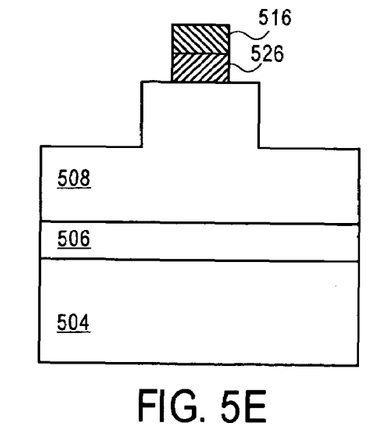
Figure 5F:
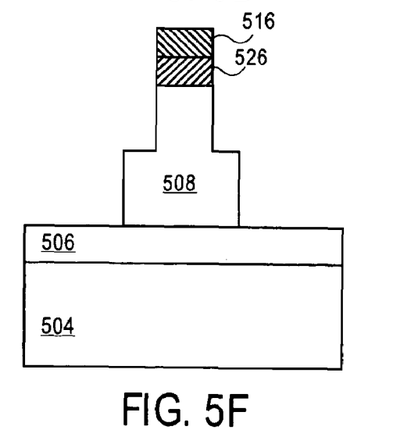

In an alternative embodiment of present invention, a multi-cornered film or structure may be formed by repeated cycles of etching a hard mask in alignment with a photoresist mask and then etching the underlying film in alignment with the hard mask prior to reducing the width of the photoresist mask. For example, a hard mask film 510 can be formed on a film 508 to be patterned, such as a semiconductor film. A photoresist mask 512 having a first width is then formed on the hard mask film 510. The hard mask film 510 is then etched in alignment with the photoresist mask 514 as illustrated in FIG. 5B. Next, prior to reducing the width of the photoresist mask 512, the film 508 is etched a first time to a first depth in alignment with the hard mask 514 as illustrated in FIG. 5C. Next, the width of a photoresist mask 512 is reduced a first time to form a reduced width photoresist mask 516 as shown in FIG. 5D. Next, as shown in FIG. 5E, the hard mask 514 is etched in alignment with the reduced width photoresist mask 516 to form a reduced width hard mask 526. The film 508 is then etched a second time in alignment with the reduced width hard mask 526 to form the structure as shown in FIG. 5F. Additional cycles of i) reducing the width of the hard mask, then ii) reducing the width of the hard mask and then iii) etching a portion of underlying film may be repeated to add additional corners or "stair steps" to film 508, if desired.

Figure 3H:
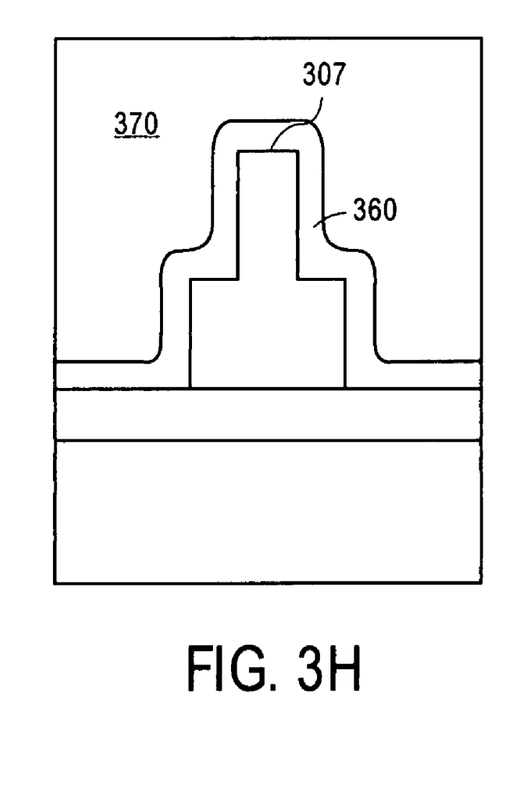

After forming a semiconductor body with multiple corners, a gate dielectric layer 360 is formed on the sidewalls 356 and 358 and the top surface 307 of semiconductor body 350 as illustrated in FIG. 3H. The gate dielectric layer may be a deposited dielectric or a grown dielectric. In an embodiment of the present invention, the gate dielectric layer 360 is a silicon oxynitride dielectric film grown by a dry/wet oxidation process. In an embodiment of the present invention, the silicon oxynitride film is grown to a thickness between 5-15 Å. In an embodiment of the present invention, the gate dielectric layer 360 is a deposited dielectric, such as but not limited to a high dielectric constant film, such as a metal oxide dielectric, such as tantalum oxide ($Ta_2O_5$), titanium oxide ($TiO_2$), hafnium oxide, zirconium oxide and aluminum oxide. Additionally, in an embodiment of the present invention, a dielectric layer 360 can be other high k dielectric films, such as but not limited to PZT and BST. Any well known technique can be utilized to deposit a high k dielectric, such as but not limited to chemical vapor deposition, atomic layer deposition, and sputtering.

Next, a gate electrode 370 is formed on the gate dielectric layer 360 formed on the top surface of semiconductor body 350 and is formed on or adjacent to the gate dielectric layer 360 formed on or adjacent to the sidewalls 356 and 358 as shown in FIG. 3H. The gate electrode 370 has a top surface opposite a bottom surface formed on insulating layer 406 and a pair of laterally opposite sidewalls 372 and 374 which define the gate length of the device. The gate electrode 370 can be formed by blanket depositing a suitable gate electrode material over the substrate and then patterning the gate electrode material with well know photolithography and etching techniques to form gate electrode 370 from the gate electrode material. In an embodiment of the present, the gate electrode material comprises polycrystalline silicon. In other embodiments of the present invention, the gate electrode material comprises a polycrystalline silicon germanium alloy. In yet other embodiments of the present invention, the gate electrode can comprises a metal film, such as but not limited to tungsten, tantalum and their nitrides. In an embodiment of the present invention, the photolithography process used to define the gate electrode utilizes a minimum or smallest dimension lithography process used to fabricate the nonplanar transistor (that is, in an embodiment of the present invention, the gate length (Lg) of the gate electrode 370 has a minimum feature dimension of the transistor defined by photolithography). In an embodiment of the present invention, the gate length is less than or equal to 30 nanometers and ideally less than 20 nanometers. It is to be appreciated that although the dielectric layer and gate electrode as illustrated in FIGS. 3H and 3I are formed with a "subtractive" process whereby undesired portions are etched away, the gate electrode can be formed with a replacement gate process whereby a sacrificial gate electrode is first formed, an interlayer dielectric formed adjacent thereto, the sacrificial gate electrode then removed to form an opening in which the gate electrode is then formed as is well known in the art.

Figure 3I:
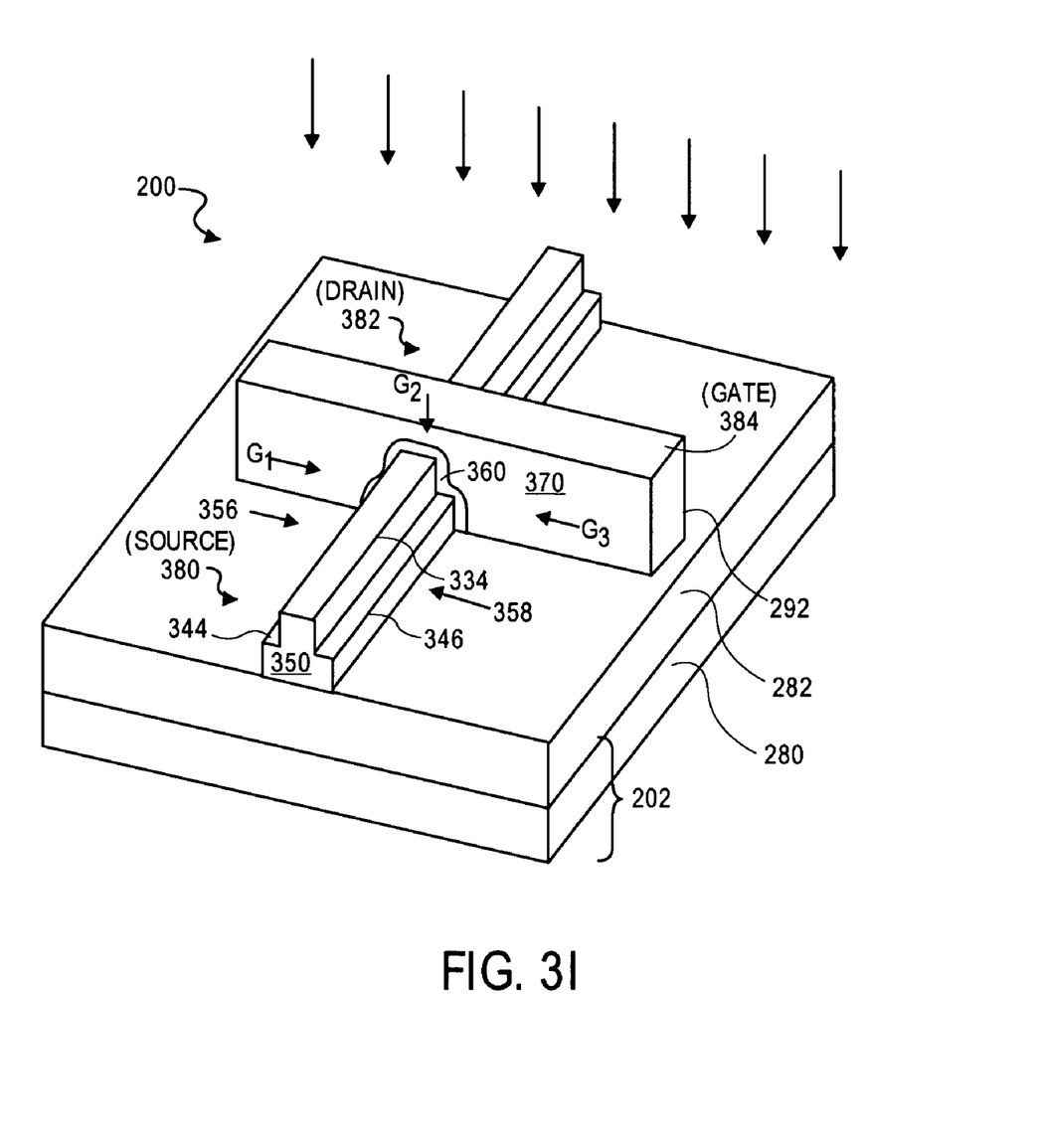

Next, as shown in FIG. 3I, a source region 380 and a drain region 382 are then formed in semiconductor body 350 on opposite sides gate electrode 370. For a PMOS transistor the semiconductor body is doped to a p type conductivity with a concentration between $1 \times 10^{20}$ to $1 \times 10^{21}$ atoms/cm$^3$. For an NMOS nonplanar transistor the semiconductor body 350 is doped with an n type conductivity to a concentration between $1 \times 10^{20}$ to $1 \times 10^{21}$ atoms/cm$^3$ to form the source/drain regions. In an embodiment of the present invention, the source/drain regions can be formed by ion-implantation. In an embodiment of the present invention, the ion-implantation occurs in a vertical direction (i.e., direction perpendicular to the substrate) as shown in FIG. 3I. If the gate electrode 370 is a polysilicon gate electrode, it can be doped during the ion-implantation process. The gate electrode 370 acts as a mask to prevent the ion-implantation step from doping the channel region of the nonplanar transistor. Again, the channel region is the portion of the semiconductor body 350 located beneath or surrounded by gate electrode 370. If the gate electrode 370 is a metal electrode a dielectric hard mask can be used to block the doping during ion-implantation process. In other embodiments, other methods, such as solid source diffusion, may be used to dope the semiconductor body 350 to form the source and drain regions. In embodiments of the present invention, the source/drain regions may also include subregions, such as source/drain extensions and source/drain contact regions. Additionally, if desired, at this time additional silicon or silicide can be formed on the semiconductor to form raised source/drain regions and reduce the contact resistance of the device. This completes the fabrication of a nonplanar device having a semiconductor body with multiple corners.

We claim:

1. A method of patterning a film comprising:
    forming a photoresist mask having a first width on a hard mask film formed on a film;
    patterning said hard mask film in alignment with said photoresist mask to produce a hard mask;
    reducing the width of said photoresist mask to form a ieduced width photoresist mask having a second width;
    etching a first portion of said film in alignment with the hard mask;
    etching said hard mask in alignment with said reduced width photoresist mask to form a reduced width hard mask; and
    etching a second portion of said film in alignment with said reduced width hard mask, wherein said etching of said second portion of said film further etches said first portion of said film.

2. The method of claims 1 wherein said first portion of said film is etched said first time after forming said reduced width photoresist mask.

3. The method of claim 1 wherein said first portion of said film is etched said first time prior to forming said reduced width photoresist mask.

4. The method of claim 1 further comprising reducing the width of said photoresist mask a second time to form a second reduced width photoresist mask;
    etching said hard mask a second time in alignment with said second reduced width photoresist mask to form a second reduced width hard mask; and
    etching a third portion of said film in alignment with said second reduced width hard mask.

5. The method of claim 1 wherein said etching of said first and second portions of said semiconductor film utilizes an anisotropic etching process.

6. The method of claim 1 wherein said photoresist mask width is reduced utilizing an $O_2$ plasma ashing.

7. The method of claim 1 wherein said film is a silicon film.

8. The method of claim 7 wherein said silicon film is etched utilizing a plasma etch process utilizing a gas chemistry comprising $HBr/CL_2/O_2$.

9. The method of claim 1 further comprising forming a dielectric layer and a gate electrode over said first portion and said second portion of said film and wherein said film is a semiconductor film.

10. A method of forming a multi-cornered nonplanar device comprising:
    forming a photoresist mask having a first width on a hard mask film formed on a semiconductor film having a first thickness formed on an insulating substrate;
    etching said hard mask film in alignment with said photoresist mask to form a hard mask having a first width, said hard mask covering a central portion of said semiconductor film and exposing a first and second portion of said semiconductor film on opposite sides of said hard mask;
    reducing the width of said photoresist mask to produce a reduced width photoresist mask having a second width;
    anisotropically first etching said semiconductor film in alignment with said hard mask having said first width so that said first and second portion of said semiconductor film has a second thickness less than said first thickness;
    etching said hard mask in alignment with said reduced width photoresist mask to form a reduced width hard mask having said second width, said reduced width hard mask exposing a third and fourth portion of said semiconductor film on opposite sides of said reduced width hard mask, wherein said third and fourth portions of said semiconductor film are part of said central portion;
    anisotropically second etching said third and fourth portions of said semiconductor film in alignment with said reduced width hard mask, wherein said anisotropically second etching of said semiconductor film also etches said first and second portions of said semiconductor film to thereby form a semiconductor body having sidewalls and a top surface wherein the sidewalls have a stair step configuration;

forming a gate dielectric layer on the side and top surface of said semiconductor body; and forming a gate electrode over said gate dielectric layer formed on said sidewalls and top surface of said semiconductor body.

11. The method of claim 10 wherein said semiconductor film is silicon.

12. The method of claim 10 wherein said hard mask is selected from the group consisting of silicon nitride and silicon oxynitride.

13. The method of claim 10 wherein said photoresist mask is reduced by a plasma ashing.

14. The method of claim 10 wherein said semiconductor film is silicon and said anisotropically first etching comprises a plasma etching processing utilizing $HBr/CO_2/O_2$.

15. A method of forming a nonplanar transistor having a multi-cornered body comprising:

forming a photoresist mask on a hard mask film formed on a semiconductor film;

patterning said hard mask film in alignment with said photoresist mask to produce a hard mask;

reducing the width of said photoresist mask to form a reduced width photoresist mask;

etching a first portion of said semiconductor film in alignment with said hard mask;

etching said hard mask in alignment with said reduced width photoresist mask to form a reduced width hard mask;

etching a second portion of said semiconductor film in alignment with said reduced width hard mask, wherein said etching of said second portion of said semiconductor film further etches said first portion of said semiconductor film;

wherein said etching of said first portion and said etching of said second portion to produce a semiconductor body having a top portion and a bottom portion;

removing said hard mask;

forming a gate dielectric layer over said top portion and said bottom portion;

forming a gate electrode on said gate dielectric layer formed on said top portion and said bottom portion of said semiconductor body; and forming a pair of source/drain regions in said semiconductor body on opposite sides of said gate electrode.

16. The method of claim 15 wherein said gate dielectric layer comprises a high-K gate dielectric.

17. The method of claim 15 wherein said semiconductor film is a silicon film.

18. A method of forming a multi-cornered semiconductor body comprising:

etching a semiconductor film a first time to a first depth in alignment with a hard mask having a first width so as to define a lower body portion having a first height;

reducing the width of said hard mask to form a reduced width hard mask;

etching said semiconductor film a second time in alignment with said reduced width hard mask so as to define an upper body portion having said second width and a second height, wherein said etching of said semiconductor film a second time further etches said lower body portion.

19. The method of claim 18 further comprising forming a gate dielectric layer over said lower body portion and said upper body portion of said semiconductor body.

20. The method of claim 18 further comprising forming a gate electrode on said gate dielectric layer on said semiconductor body.

21. A method of patterning a film comprising:

forming a photoresist mask having a first width on a hard mask film formed on a film;

patterning said hard mask film in alignment with said photoresist mask to produce a hard mask;

reducing the width of said photoresist mask to form a reduced width photoresist mask having a second width;

etching a first portion of said film in alignment with the hard mask;

etching said hard mask in alignment with said reduced width photoresist mask to form a reduced width hard mask;

etching a second portion of said film in alignment with said reduced width hard mask;

reducing the width of said photoresist mask a second time to form a second reduced width photoresist mask;

etching said hard mask a second time in alignment with said second reduced width photoresist mask to form a second reduced width hard mask; and etching a third portion of said film in alignment with said second reduced width hard mask.

* * * * *